(12) United States Patent
Jianjun et al.

(10) Patent No.: US 7,701,001 B2
(45) Date of Patent: Apr. 20, 2010

(54) SHORT CHANNEL TRENCH POWER MOSFET WITH LOW THRESHOLD VOLTAGE

(75) Inventors: Cao Jianjun, Torrance, CA (US); Kyle Spring, Temecula, CA (US); Devana Cohen, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 1361 days.

(21) Appl. No.: 10/427,469

(22) Filed: May 1, 2003

(65) Prior Publication Data

US 2003/0214011 A1   Nov. 20, 2003

Related U.S. Application Data

(60) Provisional application No. 60/378,189, filed on May 3, 2002.

(51) Int. Cl.
*H01L 29/78* (2006.01)
(52) U.S. Cl. ............................... 257/330; 257/E29.309
(58) Field of Classification Search ......... 257/500–512, 257/324–330, E29.309
See application file for complete search history.

(56) References Cited

U.S. PATENT DOCUMENTS

| | | | |
|---|---|---|---|
| 5,338,945 A | 8/1994 | Baliga et al. | |
| 5,374,571 A | 12/1994 | Mukherjee et al. | |
| 5,874,338 A * | 2/1999 | Ferla et al. | 438/268 |
| 5,879,967 A | 3/1999 | Kim | |
| 5,907,776 A | 5/1999 | Hshieh et al. | |
| 5,986,304 A | 11/1999 | Hshieh et al. | |
| 5,998,837 A | 12/1999 | Williams | |
| 6,172,398 B1 * | 1/2001 | Hshieh | 257/330 |
| 6,285,060 B1 * | 9/2001 | Korec et al. | 257/342 |
| 2001/0023104 A1 | 9/2001 | Mo | |
| 2002/0019099 A1 | 2/2002 | Williams et al. | |
| 2002/0048855 A1 | 4/2002 | Matsudai et al. | |
| 2003/0102564 A1 | 6/2003 | Darwish | |

OTHER PUBLICATIONS

International Search Report mailed Dec. 18, 2003 for PCT Application No. PCT/US03/13856.

* cited by examiner

*Primary Examiner*—Nathan W Ha
(74) *Attorney, Agent, or Firm*—Farjami & Farjami LLP

(57) ABSTRACT

A short channel trench MOSFET which has a lower peak concentration of dopants and a substantially uniform concentration of dopants compared to a conventional short channel device.

8 Claims, 5 Drawing Sheets

US 7,701,001 B2

SHORT CHANNEL TRENCH POWER MOSFET WITH LOW THRESHOLD VOLTAGE

RELATED APPLICATIONS

The application is based on and claims benefit of U.S. Provisional Application No. 60/378,189, filed on May 3, 2002, entitled Short Channel Trench Power MOSFET With Low Threshold Voltage, to which a claim of priority is hereby made.

FIELD OF THE INVENTION

The present invention relates to semiconductor devices and more particularly to MOS-gated devices.

BACKGROUND OF THE INVENTION

Referring to FIG. 1, a well known MOS-gated device typically referred to as a trench MOSFET includes a plurality of trenches 10 formed in epitaxial layer 12 which is formed over substrate 14 of a die 8. The vertical sidewalls of trenches 10 are lined with a layer of gate insulation 16 which is typically composed of $SiO_2$. The bottom of each trench also includes a layer of insulation which typically is the same material as the gate insulation material. Each trench 10 is at least partially filled with gate electrode material 18 such as doped polysilicon.

A conventional trench MOSFET also includes base region 20 which is formed in epitaxial layer 12. Base region 20 is doped with dopants of a polarity opposite to those of substrate 14 and those of the rest of epitaxial layer 12. For example, in the device depicted by FIG. 1, base region 20 includes P-type dopants while epitaxial layer 12 and substrate 14 include N-type dopants. A conventional MOSFET also includes source regions 22 formed above base region 20.

Each trench 10 extends to a depth below base region 20 and, therefore, crosses the entire length of base region 20. Upon application of a certain minimum voltage to gate conductive material 18 (threshold voltage) the portion of base region 20 adjacent a layer of gate insulation 16 is inverted to form a channel region which allows a source region 22 adjacent the channel region to be electrically connected to the part of epitaxial layer 12 below base region 20 (the drift region).

A conventional trench MOSFET also includes source contact 24 which is ohmically connected to source regions 22 and highly conductive region 26 formed in base region 20. Source contact 24 is insulated from conductive gate material 18 in each trench by insulation plugs 28. A conventional trench MOSFET such as the one shown by FIG. 1 also includes drain contact 30.

The On-resistance (Rdson) of a trench MOSFET which is the resistance between source contact 24 and drain contact 30 of a trench MOSFET increases with the length of the channel region, which corresponds to the thickness of base region 20.

In order to reduce channel resistance, a shorter channel is desirable. When the channel length is reduced, the trench depth can also be reduced. However, devices having shorter channels tend to be leaky from drain-to-source (Idss). For a device to have the ability to withstand breakdown, it must have sufficient charge in its base regions 20 to support the desired drain-to-source breakdown voltage rating. In devices having shorter channels, therefore, the peak concentration of the dopants in the base region is higher.

The higher peak concentration in the channel leads to a higher threshold voltage, which is undesirable as it increases channel resistance especially at low gate drive conditions. That is, with a conventional short channel device, the peak concentration of the channel has to be made high, which results in a high threshold voltage (Vth).

BRIEF DESCRIPTION OF THE INVENTION

A short channel trench MOSFET includes a channel region which has a lower peak concentration of dopants and a shallower and more uniform dopant concentration profile than a conventional short channel trench MOSFET. As a result a short channel trench MOSFET according to the present invention has a lower threshold voltage than a conventional short channel trench MOSFET of the same breakdown voltage rating and a lower ON resistance than a conventional trench MOSFET of the same voltage rating.

The low threshold voltage results in low Rdson specially at low gate drive conditions. The lower peak concentration in the channel region allows for the use of a thicker gate oxide without increasing the threshold voltage to excessively high levels. A thicker oxide improves gate integrity and reduces gate charge.

A short channel trench MOSFET according to the present invention is manufactured by a channel implant and drive similar to that of a conventional short channel process but at a lower channel implant dose and/or a reduced channel drive thermal budget, and then one or more additional high-energy, low-dose implants followed by a diffusion drive to render the dopant concentration in the channel region more uniform. The resulting channel region is short, and has a more uniform doping profile and is generally a shorter "square" channel.

DETAILED DESCRIPTION OF THE PREFERRED EMBODIMENTS

Figure 1:
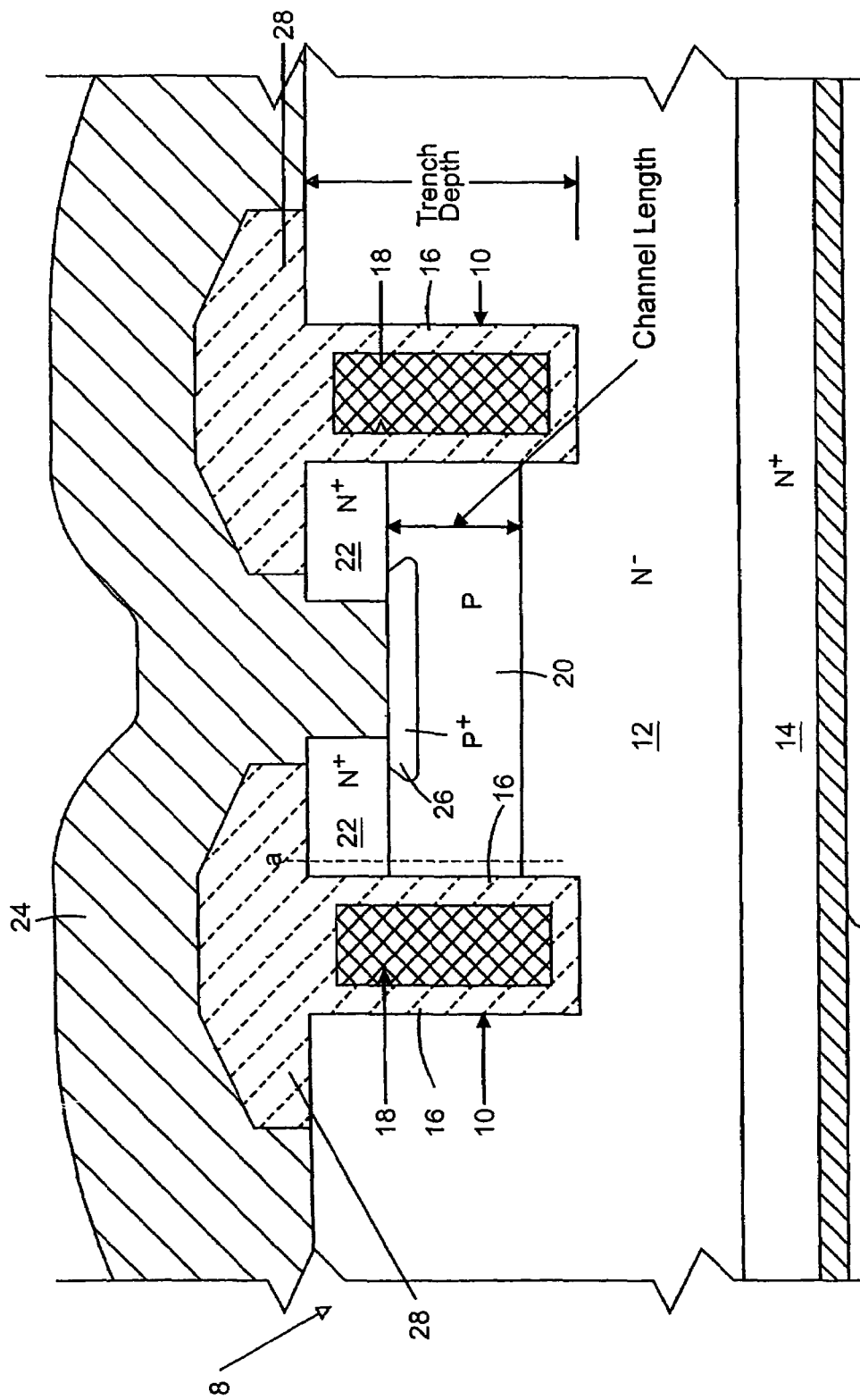
FIG. 1 is a cross-section of a small portion of the active area of a trench MOSFET according to the prior art.
Figure 2:
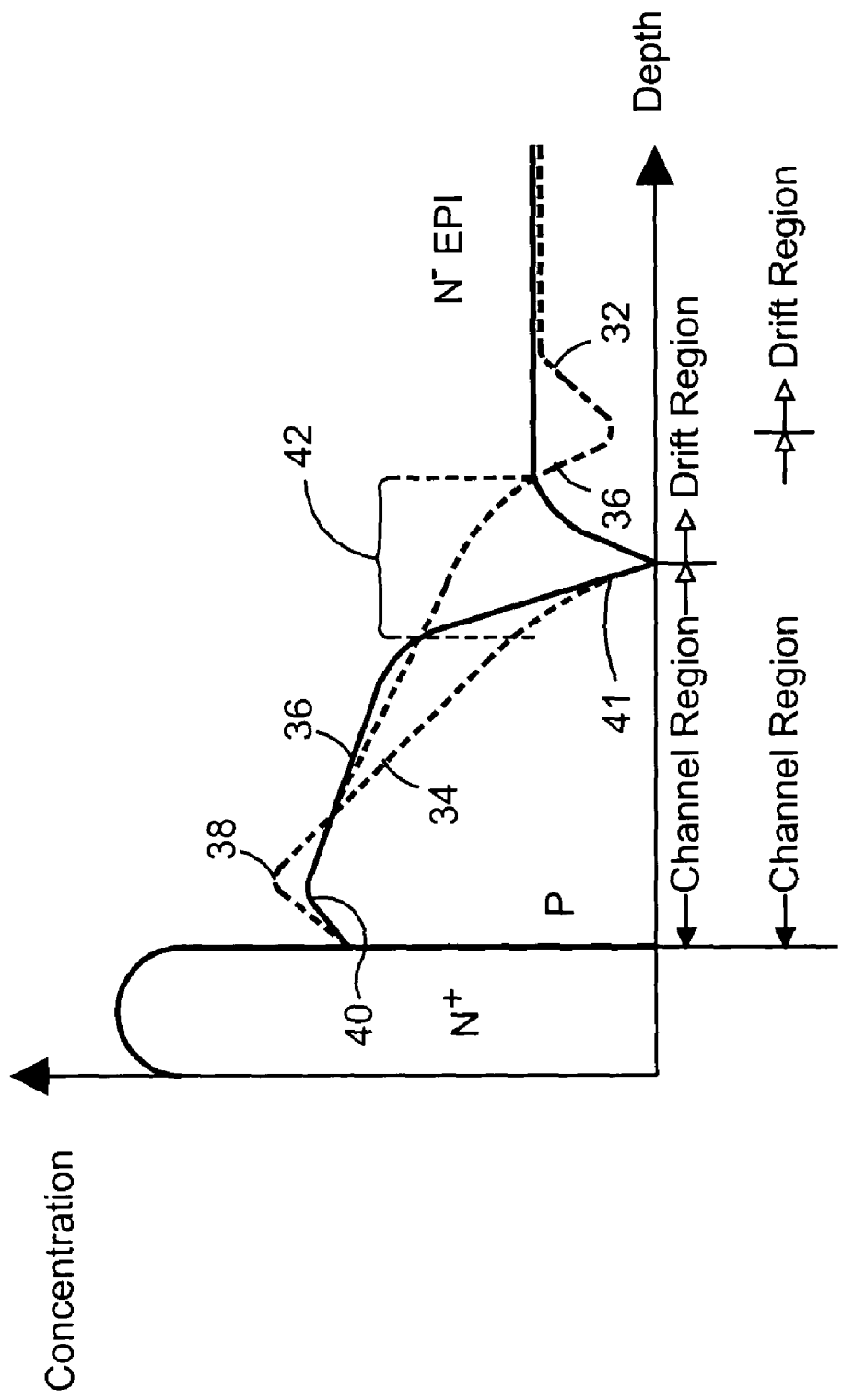
FIG. 2 shows the doping profile taken along dotted section line "a" (channel region) for a conventional trench MOSFET, a conventional trench MOSFET having a short channel, and a trench MOSFET according to the present invention.

Referring to FIG. 2, the dopant concentration profile along line "a" (channel region) in FIG. 1 for a conventional trench MOSFET (e.g., channel length=1.0-1.5 μm) is shown by first broken line 32, the dopant concentration profile along line "a" in FIG. 1 for a conventional trench MOSFET with a short channel (e.g., channel length=0.3-1.0 μm) is shown by second broken line 34, and the dopant concentration profile for a trench MOSFET according to the present invention along line "a" in FIG. 1 is shown by line 36. The dopant concentration profiles shown by FIG. 2 are for trench MOSFETs of the same breakdown voltage rating. As shown by FIG. 2, the peak concentration 38 of dopants in the channel region for a conventional trench MOSFET with a short channel is higher than the peak concentration 40 of dopants in the channel region for a conventional trench MOSFET. The higher peak concentration of dopants in a short channel device according to prior art is required in order to withstand the same breakdown voltage as a conventional trench MOSFET with a longer channel. The disadvantage of having a channel region with relatively higher dopant concentration is the increase in the threshold voltage and also the increase in the resistance of the channel region, which increases the overall Rdson of the device.

Referring to FIG. 2, a trench MOSFET according to the present invention can have substantially the same peak dopant concentration 40 as a conventional trench MOSFET, but substantially the same channel length and ability to withstand breakdown as a conventional trench MOSFET with a short channel. In other words, a device according to the present invention has a lower peak dopant concentration in its channel region, but can achieve substantially the same breakdown rating as a conventional short channel trench MOSFET. The lower peak concentration of dopants in a trench MOSFET according to the present invention decreases the threshold voltage and thus overcomes the disadvantages of the prior art short channel trench MOSFETs, while at the same time exhibits lower ON resistance than a conventional trench MOSFET because of its shorter channel.

A trench MOSFET according to the present invention can have the same breakdown voltage rating as a prior art short channel trench MOSFET because the dopant concentration in the channel region of a trench MOSFET according to the present invention decreases at a much lower rate than that of a prior art short channel trench MOSFET. Specifically, as seen in FIG. 2, the overall slope of the dopant concentration profile between the peak dopant concentration 40 and a region in the vicinity of the drift region (near the end of the channel region where the base region forms a PN junction with the drift region) is substantially shallower than the overall slope of the dopant concentration profile for the same area in a short channel trench MOSFET according to the prior art. The shallow overall slope is an indication of a relatively uniform dopant concentration in the channel region of a trench MOSFET according to the present invention. That is, the dopant concentration of a major portion of the channel region of a trench MOSFET according to the present invention is substantially the same as the peak dopant concentration in the channel region.

It should be noted that the dopant concentration in the channel region of a trench MOSFET of the present invention changes very rapidly in the vicinity of the drift region. The rapid change in the dopant concentration is seen in FIG. 2 where it is shown that the dopant concentration profile in the channel region approaches the drift region at a near vertical slope close to the drift region.

Unlike an ideal PN junction in which the dopant type of one region abruptly changes to another type of dopants, in a practical PN junction there is a region in which the concentration of dopants of a dominant polarity in one region changes gradually until a minimum value is reached, and then the concentration of dopants of an opposite polarity gains dominance. The near vertical slope of the dopant concentration in the channel region of the present invention shows the concentration of dopants in the channel region decreasing rapidly until a minimum value is reached. Thereafter, the concentration of dopants opposite to those in the source region is increased until a uniform dopant concentration is reached. The point at which the change in the dominance of concentration of dopants takes place can be considered the junction region in a practical PN junction.

The gradual rather than the abrupt change in the dopant concentrations in a practical PN junction is largely due to interdiffusion of dopants between the P region and the N region during processing, specifically during implantation and diffusion. The region in which interdiffusion of dopants occurs has been labeled accordingly as the interdiffusion region 42. As is shown in FIG. 2, the concentration of dopants in a channel region according to the present invention decreases rapidly in the interdiffusion region until junction 41 is reached. As a result the concentration profile of the channel region in a trench MOSFET according to the present invention resembles a corner of a square. In contrast, the dopant concentration in the channel region of a short channel trench MOSFET according to prior art changes at substantially the same rate from its peak concentration 38 until junction 41 is reached.

Figure 3:
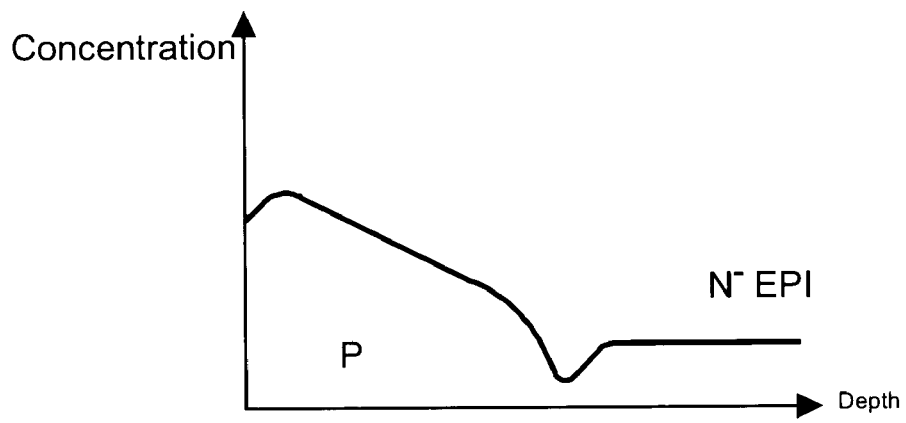
FIG. 3 shows the doping profile across line "a" in FIG. 1 after the initial channel implant and drive steps.
Figure 4:
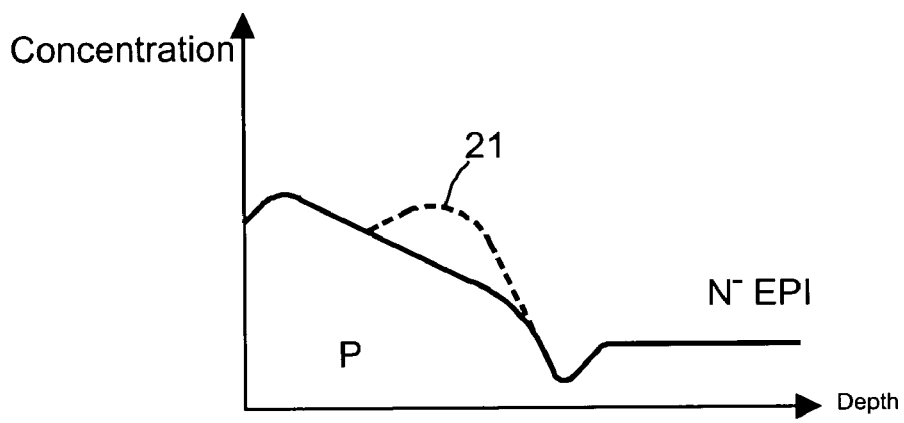
FIG. 4 shows the doping profile across line "a" after an additional high energy, low dose boron implant and activation.
Figure 5:
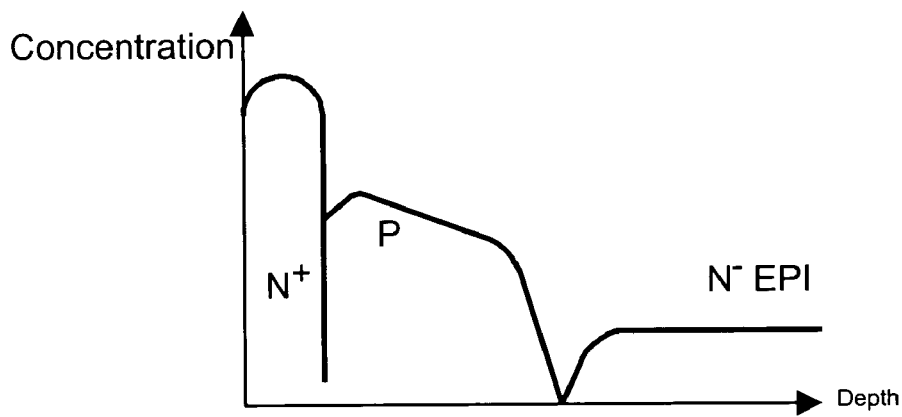
FIG. 5 shows the doping profile across line "a" after the source implant and diffusion drive.

FIGS. 3-5 illustrate the results of a process by which a device according to the present invention is formed. Referring first to FIG. 3, a conventional channel implant and drive is first carried out which results in the dopant concentration profile shown in FIG. 3. Next, an additional high energy, low dose implantation step is carried out to change the dopant concentration of a selected portion of channel region as graphically illustrated by broken line 21 in FIG. 4. The implantation step may be carried out, for example, by appropriate masking and implanting steps. Next, the implants are diffused in a diffusion drive to obtain the dopant concentration profile shown in FIG. 5.

Referring to FIGS. 6 to 9, a process for manufacturing a short channel trench MOSFET is carried out as follows.

Figure 6:
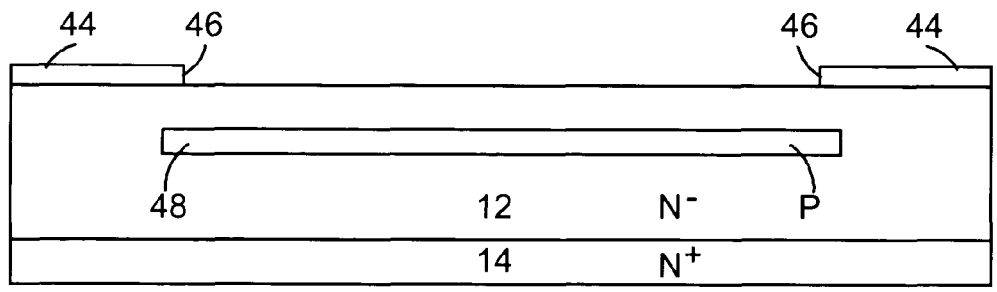
FIGS. 6-10 show the relevant steps in the manufacture of a device according to the present invention.

Referring first to FIG. 6, a layer of field oxide 44 is grown atop epitaxial layer 12 of die 8. Using photolithography, window 46 is opened in the layer of field oxide 44 to expose an area on the epitaxial layer in which the active region of the device will be formed. Thereafter, using window 46 as a mask a counter-doped region 48 is formed in epitaxial layer 12 through implantation of boron atoms at about 20 KeV to 120 KeV with a dose of about 3E13 to 2E14 ions/cm2.

Figure 7:
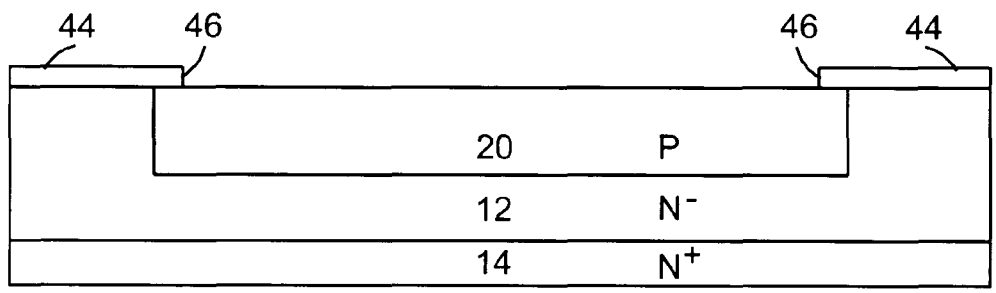

Referring next to FIG. 7, the implants in counter-doped regions are driven in a diffusion drive for about 30-240 minutes at about 1050C-1125C to form base region 20 to a depth of between 0.8 to 1.5 um. The resulting concentration profile of the channel region at this stage is shown by FIG. 3. It should be noted that to form a short channel device the depth of the base region may be adjusted to allow for channel regions of about 0.3-1.0 microns thick.

Figure 8:
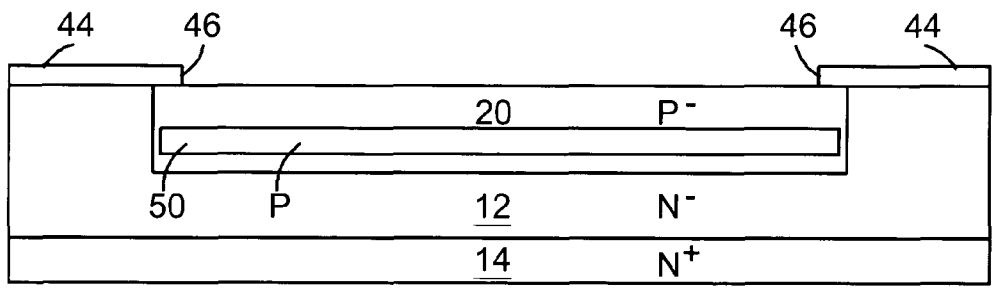

Referring next to FIG. 8, deep implant region 50 is formed in base region through implantation of boron atoms at about 300 KeV to 1 MeV with a dose of about 5E11 to 1E13 ions/cm2. The resulting concentration profile of the channel region at this stage is shown by FIG. 4.

Figure 9:
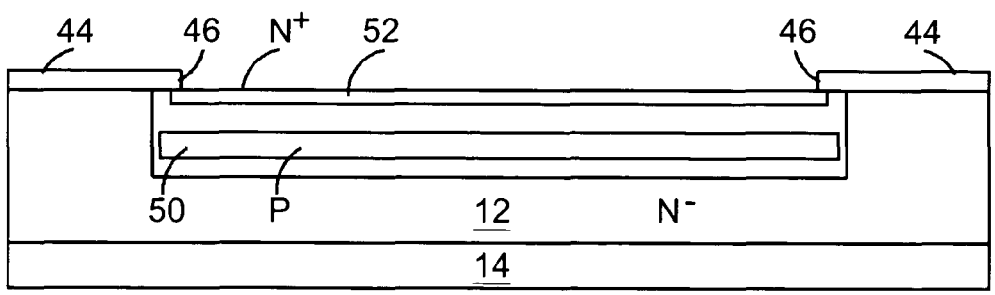
Figure 10:
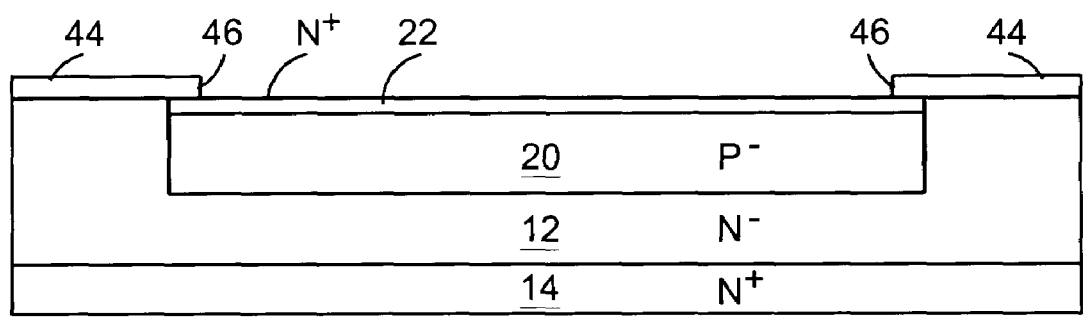

Referring next to FIG. 9, source dopants of opposite conductivity to dopants of base region 20 are implanted to form source implant region 52 in base region 20. Thereafter, the dopants in deep implant region 50 and source implant region 52 are driven in a diffusion drive to obtain the structure depicted by FIG. 10. The resulting concentration profile of the channel region at this stage is shown by FIG. 5.

Thereafter, any conventional technique may be employed to form the other elements of the device as seen in FIG. 1 to obtain a device according to the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A semiconductor device comprising:
   a gate structure that includes at least one gate insulation layer;
   a source region;
   a channel region adjacent said source region and said gate insulation layer; and
   a drift region adjacent said channel region, said channel region having a length;
   wherein said channel region has a dopant concentration profile which extends from a peak concentration to the beginning of an interdiffusion region at a first rate of change, and from said beginning of said interdiffusion region to said drift region at a second rate of change, said first rate of change being substantially smaller than said second rate of change such that said concentration profile in said channel region resembles a corner of a square.

2. A semiconductor device according to claim 1, wherein said length of said channel is between about 0.3 to about 1.0 microns.

3. A semiconductor device according to claim 1, wherein said channel region is substantially uniformly doped.

4. A semiconductor device according to claim 1, wherein said peak concentration and said intermediate concentration are substantially equal.

5. A semiconductor device according to claim 1, wherein said gate structure is a trench having opposing sidewalls formed in an epitaxial layer of semiconductive material supported atop a semiconductive substrate, each one of said sidewalls being lined with said at least layer of gate oxide.

6. A semiconductor device according to claim 1, wherein said channel region is in a base region, said base region being of a conductivity opposite to said drift region.

7. A semiconductor device according to claim 6, further comprising a source contact and a high conductivity region of the same conductivity type as said base region, said high conductivity region being formed in said base region, wherein said source contact is in ohmic contact with said source region and said high conductivity region.

8. A semiconductor device according to claim 7, wherein said source contact extends into a recess and wherein said high conductivity region is located at the bottom of a recess and said source region is located at a sidewall of said recess.

* * * * *